United States Patent
Hashimoto

[19]
[11] Patent Number: 6,080,610
[45] Date of Patent: *Jun. 27, 2000

[54] METHOD A CMOS TRANSISTOR AND ISOLATED BACK ELECTRODES ON AN SOI SUBSTRATE

[75] Inventor: Makoto Hashimoto, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/724,836

[22] Filed: Oct. 3, 1996

Related U.S. Application Data

[62] Division of application No. 08/468,308, Jun. 6, 1995, Pat. No. 5,619,054.

[30] Foreign Application Priority Data

Jun. 14, 1994 [JP] Japan ................ P06-156669

[51] Int. Cl.[7] .................................................. H01L 21/84
[52] U.S. Cl. ......................... 438/157; 438/154; 438/283
[58] Field of Search .................... 437/21, 40 TFT, 437/41 TFT, 225, 228, 80 L, 913, 974, 34, 56, 57; 148/DIG. 12, DIG. 150; 438/157, 153, 154, 231, 232, 283

[56] References Cited

U.S. PATENT DOCUMENTS

| | | | |
|---|---|---|---|
| 4,980,308 | 12/1990 | Hayashi et al. | 437/974 |
| 4,996,575 | 2/1991 | Ipri et al. | 257/369 |
| 5,185,535 | 2/1993 | Farb et al. | 438/157 |
| 5,202,273 | 4/1993 | Nakamura | 437/21 |
| 5,399,509 | 3/1995 | Iranmanesh | 437/162 |
| 5,437,762 | 8/1995 | Ochiai et al. | 148/DIG. 12 |
| 5,474,952 | 12/1995 | Fujii | 148/DIG. 12 |
| 5,597,739 | 1/1997 | Sumi et al. | 437/21 |

*Primary Examiner*—Michael Trinh
*Attorney, Agent, or Firm*—Ronald P. Kananen; Rader, Fishman & Grauer

[57] ABSTRACT

The present invention is intended to provide, in MOS transistors used as a bonding layer for silicon regions of an SOI substrate, an nMOS transistor on a silicon region of an SOI substrate which uses a polycrystalline silicon layer as a layer to be bonded with the silicon substrate and a pMOS transistor on another silicon region of the SOI substrate and electrically isolated back gate electrodes through a back gate insulation film on the silicon region side between the silicon regions and a polycrystalline silicon layer. A leak current is reduced and a malfunction of the transistors is eliminated by providing pickup electrodes for the back gate electrodes.

23 Claims, 5 Drawing Sheets

METHOD A CMOS TRANSISTOR AND ISOLATED BACK ELECTRODES ON AN SOI SUBSTRATE

This application is a division of application Ser. No. 08/468,308 filed Jun. 6, 1995, U.S. Pat. No. 5,619,054.

BACKGROUND OF THE INVENTION

1. Field of the Invention

The present invention relates to a CMOS transistor to be formed on an SOI substrate and a method for forming the SOI substrate for the CMOS transistor.

2. Description of Related Art

For manufacturing an SOI substrate in a low temperature process, a wafer bonding method using a boron phosphor silicate glass (BPSG) has been proposed. A structure of the SOI substrate formed by this manufacturing method is described below.

As shown in FIG. 1, a boron phosphor silicate glass (BPSG) layer 2 is located on the bonding surface of the substrate 1. In addition, a polycrystalline silicon layer 11 and a silicon oxide layer 12 for embedding are located on a side to be bonded onto the BPSG layer 2. A plurality of silicon regions 13 and 14 are located on the silicon oxide layer 12.

Devices such as MOS transistors and nodes are formed on the silicon regions 13, 14. FIG. 1 shows a CMOS transistor formed on the substrate. nMOS transistors 13, 15 are formed on the silicon region 13 while pMOS transistors 14, 16 are formed on the silicon region 14.

In addition, an interlayer insulation film 17 is formed to cover the nMOS and pMOS transistors 15, 16.

However, the polycrystalline silicon layer below the CMOS transistors remains electrically floating. Therefore, the potential of the polycrystalline silicon layer is unstable, and affects the channel and node potentials of the nMOS and pMOS transistors through the silicon oxide layer. This is a cause of faulty operation or circuit malfunction.

In order to avoid the above problem, a structure as shown in FIG. 2 has been proposed.

Specifically, as described in the prior art, the nMOS transistor 15 is formed on the silicon region 13 and the pMOS transistor 16 is formed on the silicon region 14.

A contact hole 21 is formed, through the silicon oxide layer 12 and the interlayer insulation film 17, to the polycrystalline silicon layer 11. Moreover, an electrode 22 is connected with the polycrystalline silicon layer 11 through the contact hole 21, for fixing the potential at a specified value.

However, in a CMOS transistor circuit comprising the nMOS transistor 15 and the pMOS transistor 16 as described above, the back channel of the pMOS transistor 16 is formed as an enhancement type in a case that, for example, the polycrystalline silicon layer 11 is regarded as a gate and the potential of the polycrystalline silicon layer 11 is fixed so that the back channel of the nMOS transistor 15 is formed as a depression type. Therefore, a leak current increases. The thinner a film of the silicon oxide layer 12 becomes, the more this phenomenon will be intensified.

A method for doping impurities in the polycrystalline silicon layer 11 is available as a method for reducing the leak current. In this method, however, grinding for smoothing the polycrystalline silicon layer 11 is difficult because impurities should be doped in the polycrystalline silicon layer 11 before grinding for smoothing the polycrystalline silicon layer 11.

In other words, it is difficult to mirror-finish the surface of the polycrystalline silicon layer 11 in which impurities are doped in high concentrations.

OBJECTS AND SUMMARY OF THE INVENTION

A first object of the present invention is to provide a CMOS transistor formed on an SOI substrate which excels in preventing a polycrystalline silicon layer below the transistors from remaining in an electrically floating condition and reduction of a leak current.

A second object of the present invention is to provide low leak current CMOS transistors on an SOI substrate.

The present invention is also intended to provide a method for manufacturing an SOI substrate for a CMOS transistor formed on the SOI substrate and a CMOS transistor which is made to attain the above-described objects.

The SOI substrate is formed by using a polycrystalline silicon layer as a layer to be bonded with the silicon substrate. Simultaneously, a plurality of silicon regions are formed on an insulation layer on the polycrystalline silicon layer. An nMOS transistor is provided on at least one silicon region of such an SOI substrate. A pMOS transistor is provided on the other silicon region of the SOI substrate. Back gate electrodes are provided through the back gate insulation film on respective silicon regions between the silicon regions and the polycrystalline silicon region. In addition, the electrodes, which are led out on the surface of the SOI substrate, are connected to the back gate electrodes.

When the back gate electrodes are provided between the silicon regions where the nMOS transistor is formed and the polycrystalline silicon layer, the electrodes have a p-type conductivity. When the back gate electrodes are provided between the silicon regions where the pMOS transistor is formed and the polycrystalline silicon layer, the electrodes have an n-type conductivity.

A method of manufacturing the SOI substrate for the CMOS transistor is as follows. In the first step, a plurality of island type silicon regions are formed by providing grooves in the silicon substrate; a back gate insulation film is formed on the surface of the silicon substrate including the internal walls of these grooves; then the back gate electrodes are formed convexly in respective silicon regions through the back gate insulation film. In the second step, p-type impurities are introduced into the back gate electrodes on the silicon regions, where an nMOS transistor is formed; and n-type impurities are introduced into the back gate electrodes on the silicon regions, where an pMOS transistor is formed. In the third step, the insulation layer and the polycrystalline silicon layer are formed on the back gate electrodes, and then the surface of the polycrystalline silicon layer is flattened. In the fourth step, the flattened surface of the polycrystalline silicon layer is bonded with another silicon substrate. In the fifth step, silicon of the original substrate is removed from the back until the back gate insulation film is exposed. Then, the isolated silicon regions are obtained.

The CMOS transistor using the above-described SOI substrate is provided with back gate electrodes on respective silicon region sides between respective silicon regions and the polycrystalline silicon layer through the back gate insulation film, and is also provided with pickup electrodes to be connected to the back gate electrodes. Moreover, a predetermined voltage is applied respectively to the back gate electrodes. When a predetermined potential is applied to the polycrystalline silicon layer, the back gate polycrystalline silicon layer surrounding the silicon island can shield the electric field from the bonding polycrystalline silicon layer, which is electrically floating. Accordingly, the active region and the node of the MOS transistor formed on respective silicon regions are not affected by the floating potential of the bonding polycrystalline silicon layer.

The back gate electrodes, provided between the silicon regions on which an nMOS transistor is formed and the polycrystalline silicon layer, have a p-type conductivity. The back gate electrodes, provided between the silicon regions on which a pMOS transistor is formed and the polycrystalline silicon layer, have an n-type conductivity. Therefore, a difference of work function between the back gate electrodes and the channels becomes large. Consequently, a leak current flowing on the surface of the SOI substrate is reduced.

In the above-described method of manufacturing the SOI substrate for the CMOS transistor, after forming a plurality of island type silicon regions by providing grooves in the silicon substrate in a first step, a back gate insulation film is formed on the surface of the silicon substrate including the internal walls of these grooves. In addition, after further forming the back gate electrodes on the back gate insulation film on respective silicon regions, an insulation layer and a polycrystalline silicon layer for bonding are formed. Therefore, when the SOI substrate is formed, the back gate electrodes between the polycrystalline silicon region for bonding and respective silicon regions are electrically isolated.

DETAILED DESCRIPTION OF THE PREFERRED EMBODIMENTS

Preferred embodiments of the present invention are described in detail, referring to the accompanying drawings thereof.

Figure 1:
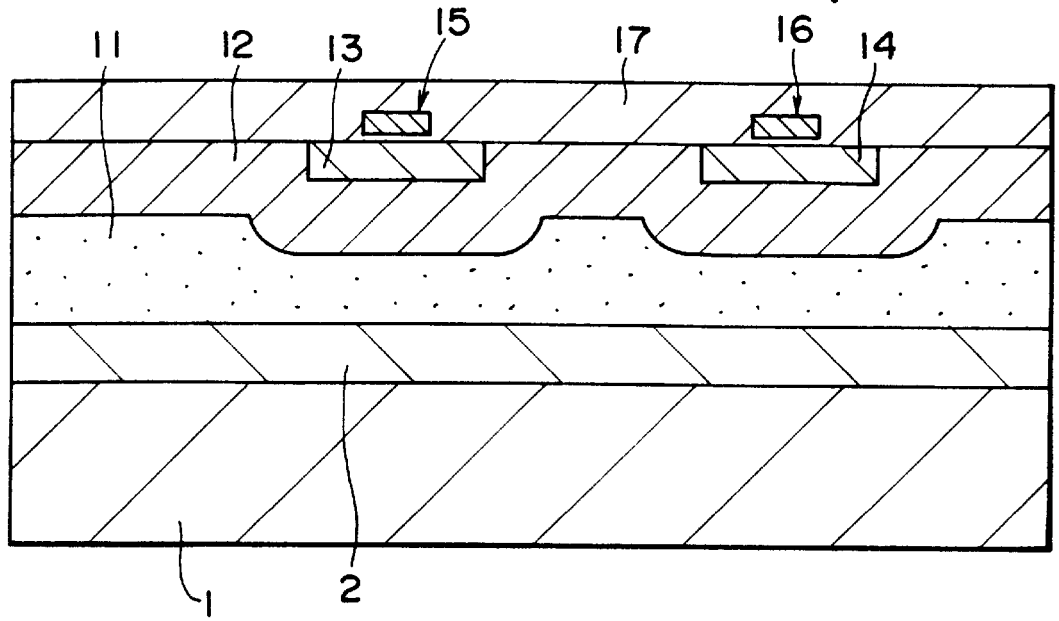
FIG. 1 is a cross sectional view of a schematic configuration of a SOI structure transistor of the related art.
Figure 2:
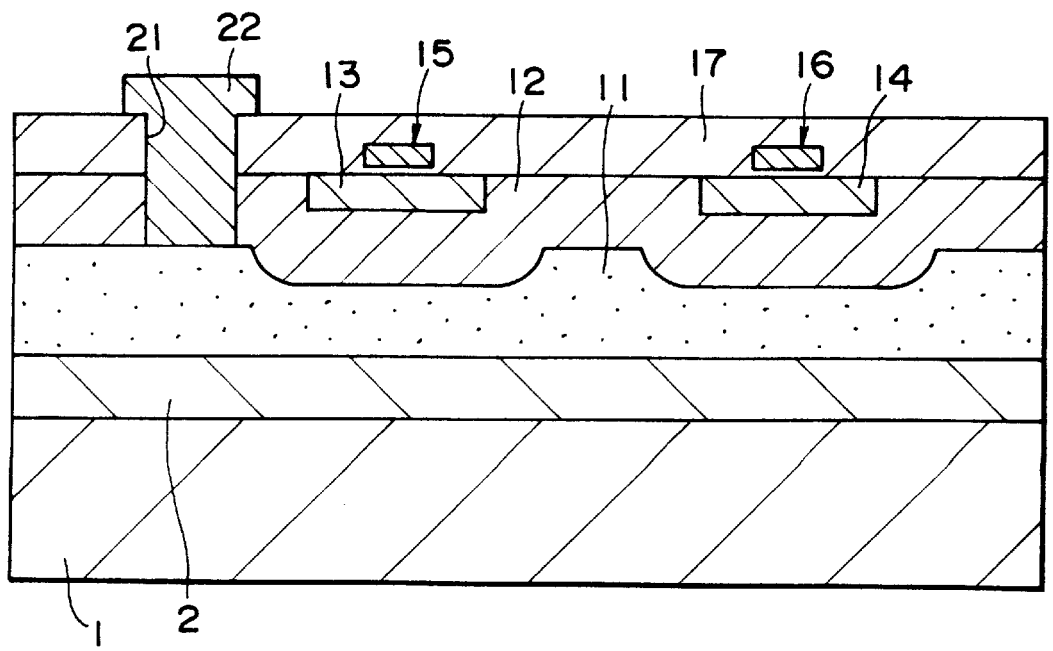
FIG. 2 is an illustration of a subject related to a transistor structure shown in FIG. 1.
Figure 3:
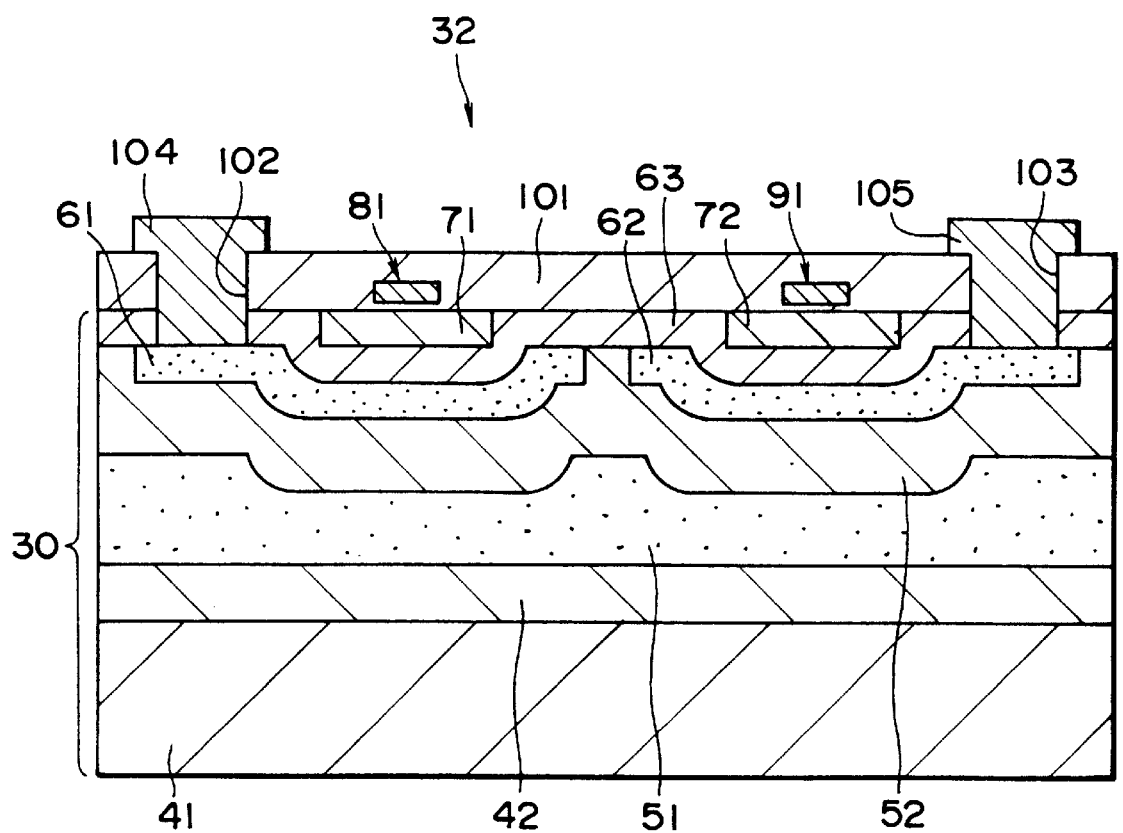
FIG. 3 is a cross sectional view of a schematic configuration of a SOI structure transistor according to a first embodiment of the present invention.

A first embodiment of the present invention is described referring to FIG. 3 which shows the cross sectional view of the schematic configuration. In the following description, relative positions of component parts are based on the drawings.

As shown in the drawings, for example, a boron phosphor silicate glass (BPSG) layer 42 is formed on a bonding surface of a silicon substrate 41. This BPSG layer 42 is bonded with the polycrystalline silicon layer 51 whose bonding surface is flattened. An insulation layer 52 is formed on this polycrystalline silicon layer 51. The insulation layer 52 is made of, for example, silicon oxide.

Back gate electrodes 61 and 62 which are electrically isolated are formed on the insulation layer 52.

In addition, a back gate insulation film 63 is formed on the insulation layer 52 to cover the back gate electrodes 61 and 62.

Silicon regions 71 and 72 are provided on the upper layer of the back gate insulation film 63 above the back gate electrodes 61 and 62.

The back gate electrodes 61 and 62 preferably provide an opposite conductivity to the channels of MOS transistors which are formed on the silicon regions 71 and 72 above the back gate electrodes. For example, in a case that the nMOS transistor 81 is formed in the silicon region 71, the back gate electrode 61 below the silicon region 71 preferably provides the p-type conductivity. For example, in a case that the pMOS transistor 91 is formed in the silicon region 72, the back gate electrode 62 below the silicon region 72 preferably provides the n-type conductivity.

An interlayer insulation film 101 is formed on the back gate insulation film 63 to cover the nMOS transistor 81 and the pMOS transistor 81.

Contact holes 102 and 103 connected to the back gate electrodes 61 and 62 are formed in the interlayer insulation film 101 and the back insulation film 63. In these contact holes 102 and 103, pickup electrodes 104 and 105 to which a predetermined voltage is applied are provided to be connected to the back gate electrodes 61 and 62.

The pickup electrode 104 is connected to the ground (not shown) whose potential is fixed at the ground potential. The pickup electrode 105 is connected to, for example, a power supply line Vcc (not shown) and its potential is fixed at the power supply voltage.

As described above, a CMOS transistor 32 is formed with the nMOS transistor 81 and the pMOS transistor 91 which are formed on the silicon regions 71 and 72 of the SOI substrate.

In the above-described CMOS transistor 32, the back gate electrodes 61 and 62 are provided through the back insulation film 63 on respective silicon regions 71 and 72 between the silicon regions 71 and 72 and the polycrystalline silicon layer 51. The pickup electrodes 104 and 105, which are connected respectively to the back gate electrodes 61 and 62, are provided. A predetermined voltage is therefore applied to the back gate electrodes 61 and 62 through the pickup electrodes 104 and 105. Therefore, when the predetermined voltage is applied to the polycrystalline silicon layer 51, the silicon regions 71 and 72 are not electrically affected by the potential of the polycrystalline silicon layer 51 owing to the so-called static shielding effect of the back gate electrodes 61 and 62. Accordingly, active regions 82 and 92 and nodes (not shown) of the MOS transistors 30 formed on respective silicon regions 71 and 72 are not affected by the potential.

The back gate electrode 61, provided between the silicon region 71 of the nMOS transistor 81 and the polycrystalline silicon layer 51, has the p-type conductivity, and the back gate electrode 62, provided between the silicon region 72 of the pMOS transistor 91 and the polycrystalline silicon layer 51, has the n-type conductivity. Owing to this, the difference of work function between the back gate electrode 61 and the channel (not shown) of the nMOS transistor 81 becomes great. In addition, the difference of the same function between the back gate electrode 62 and the channel (not shown) of the pMOS transistor 91 also becomes great. Therefore, the leak current flowing on the surface of the SOI substrate can be reduced.

A method for manufacturing the SOI substrate for the CMOS transistor is described referring to the manufacturing process chart 3 shown in FIGS. 4A to 4H.

In the drawings, the same component parts as shown in FIG. 3 are given the same reference numerals. In the following description, the relative positions of the component parts are based on the drawings.

Figure 4A:
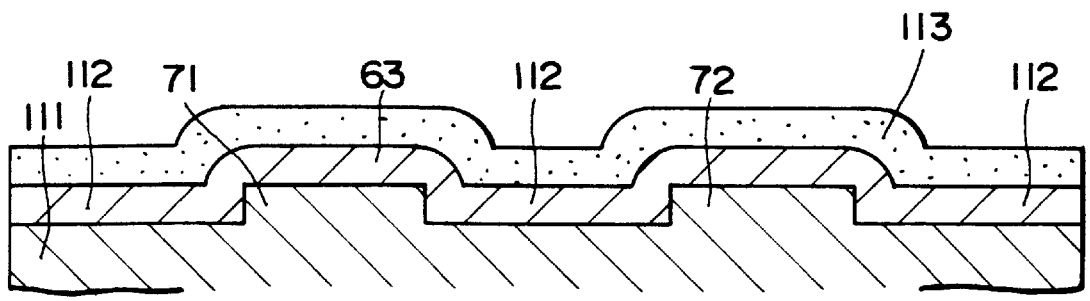
FIGS. 4A to 4H are respectively a manufacturing step for the SOI structure transistor according to a second embodiment of the present invention.

As shown in FIG. 4A, in a first step, a groove 112 having a depth of, for example, approximately 100 nm is provided in the silicon substrate 111 by a lithographic technique and etching to form a plurality of convex silicon regions 71 and 72.

For etching, dry etching using, for example, hydrogen bromide (HBr) as an etching gas is conducted. In addition to the above, hydrogen chloride (HCl) based gases can be used as the etching gas.

After this, a back gate insulation film 63 made of silicon oxide with a thickness of, for example, approximately 100 nm is formed on the silicon substrate 111 including the internal wall of the above-described groove 112 by a thermal oxidation method.

The back insulation film 63 can be formed by, for example, the CVD method. In this case, silicon oxide can be deposited after forming in advance a thermally oxidized film (not shown) on the surface of the silicon substrate 111 including the internal wall of the groove 112 by the thermal oxidation method.

Subsequently, a polycrystalline silicon film 113 with a film thickness of, for example, 300 nm is formed by the CVD method (thermal decomposition method using, as an example, silane (SiH4) as a raw material gas). This polycrystalline silicon film 113 can be formed to be thinner.

Figure 4B:
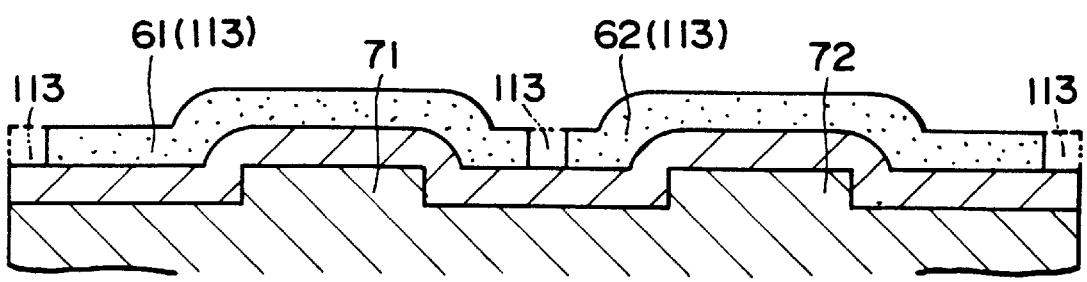

After this, as shown in FIG. 4B, the back gate electrodes 61 and 62 comprising the polycrystalline silicon film (113) are formed likewise islands on the back gate insulation film 63 on respective silicon regions 71 and 72 by removing a part of the polycrystalline silicon film (113) shown with a two-dot broken line by the lithographic technique and etching. In this case, dry etching is carried out using a hydrogen chloride (HCl)-based etching gas. Other kinds of etching gases generally used for etching the polycrystalline silicon film 113 can be used.

Figure 4C:
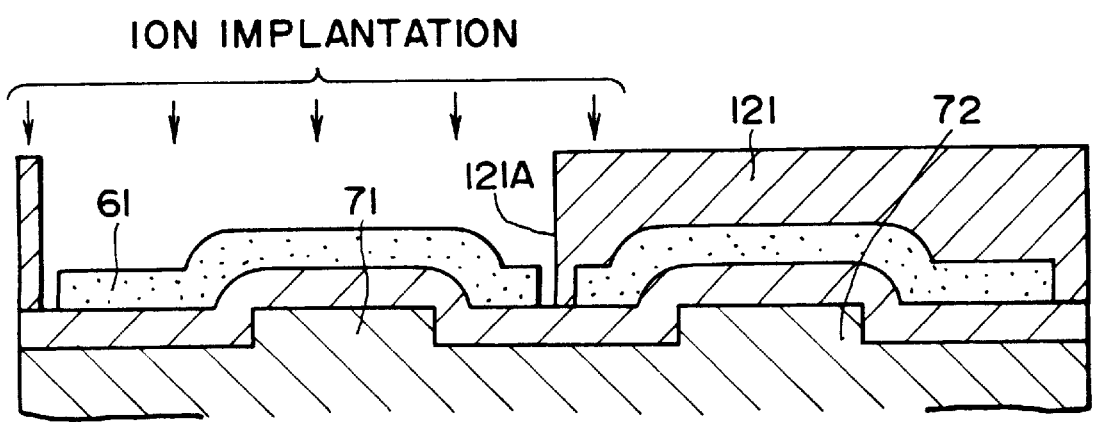

Then the second step is carried out. In this step, as shown in FIG. 4C, a mask 121 is formed with a resist in order to make an opening 121A on the silicon region 71 by the lithographic technique and etching. This opening 121A is located on the island type silicon regions 71 and 72. After this, a p-type impurity is introduced into the back gate electrode 61 on the silicon region 71 by an ion implantation method. For example, boron ($B^+$) or boron difluoride ($BF2^+$) is used as the p-type impurity.

The mask 121 is then removed by, for example, ashing treatment or wet treatment.

Figure 4D:
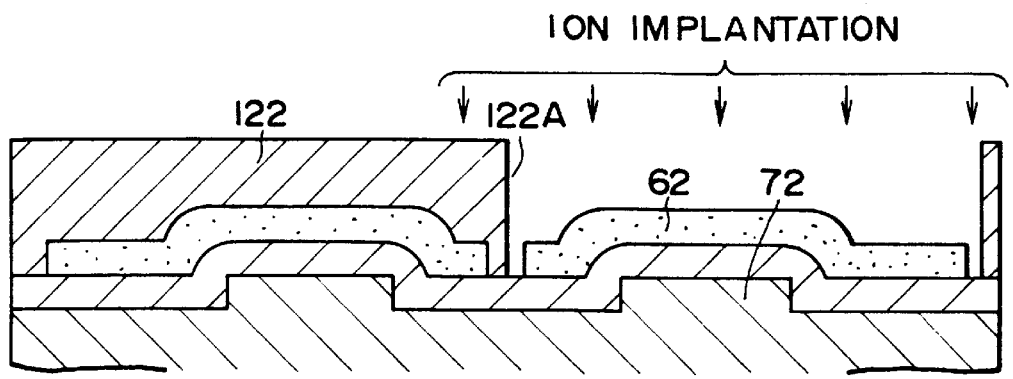

Subsequently, as shown in FIG. 4D, a mask 122 provided with an opening 122A is formed with a resist on the silicon region 72 of the pMOS transistor. An n-type impurity is then introduced into the back gate electrode 62 on the silicon region 72 by the lithographic technique. For example, arsenic ($As^+$), phosphor ($P^+$) or antimony ($Sb^+$) is used as the n-type impurity.

The mask 122 is then removed by, for example, ashing treatment or wet treatment.

Figure 4E:
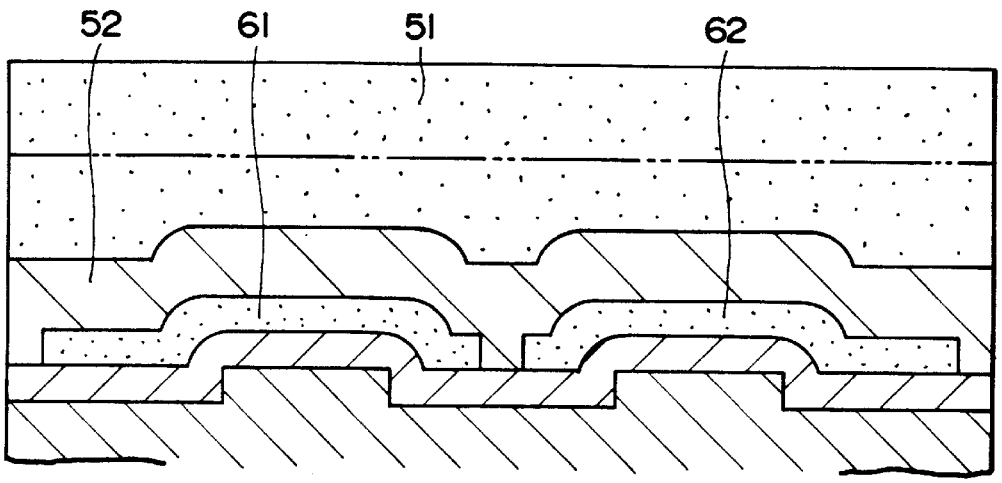

Subsequently, a third step shown in FIG. 4E is carried out. In this step, an insulation layer 52 is deposited on the whole surfaces of the back gate electrodes 61 and 62 by the CVD method. This insulation layer 52 is made of, for example, silicon oxide and formed in a thickness of approximately 600 nm. The CVD method for forming the insulation layer 52 such as silicon oxide is carried out by a thermal decomposition method using silane ($SiH_4$) and oxygen ($O_2$) as raw material gases. Formation of the insulation layer is not limited to the thermal decomposition method and can be carried out by, for example, a plasma CVD method or a photo-assisted CVD method.

Subsequently, a polycrystalline silicon layer 51 with a thickness of, for example, approximately 5 μm is deposited on the insulation layer 52. This CVD method is carried out by a thermal decomposition method using silane ($SiH_4$) as raw material gas. Formation of the polycrystalline silicon layer is not limited to the thermal decomposition method and can be carried out by, for example, a plasma CVD method or a photo-assisted CVD method.

After this, the upper surface of the polycrystalline silicon layer 51 is removed by grinding to flatten the surface until the above part shown with a two-dot broken line of its layer 51 is exposed. In this case, the surface of the polycrystalline silicon layer 51 is ground so that the thickness of the thin part thereof becomes approximately 2 μm.

Figure 4F:
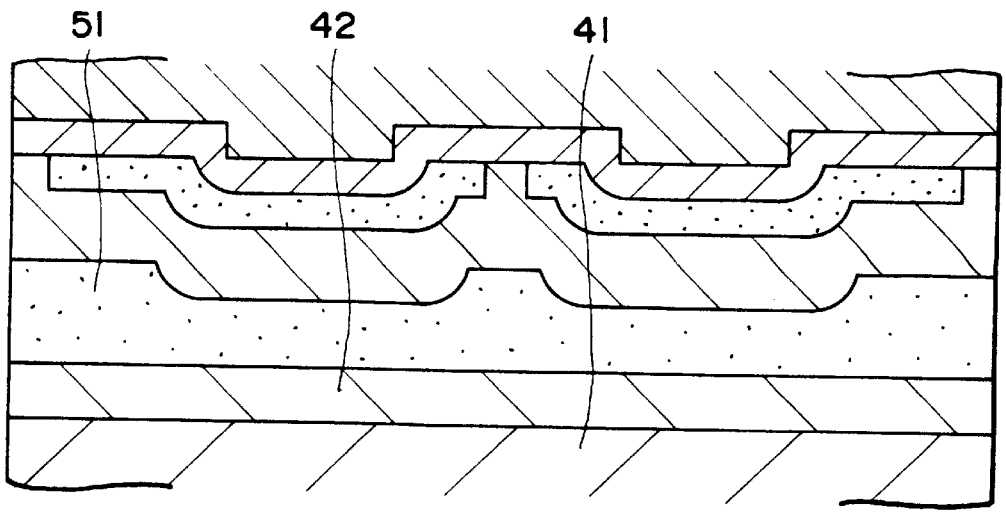

Then a fourth step shown in FIG. 4F is carried out. In FIG. 4F and following drawings, the component parts shown in FIGS. 4A to 4E are shown up side down.

In this step, a substrate 41 is bonded with the surface of the polycrystalline silicon layer 51. The boron phosphor silicate glass (BPSG) layer 42 is formed on the bonding surface of this substrate 41. This bonding process is carried out by setting the temperature for bonding at, for example, 950° C.

Figure 4G:
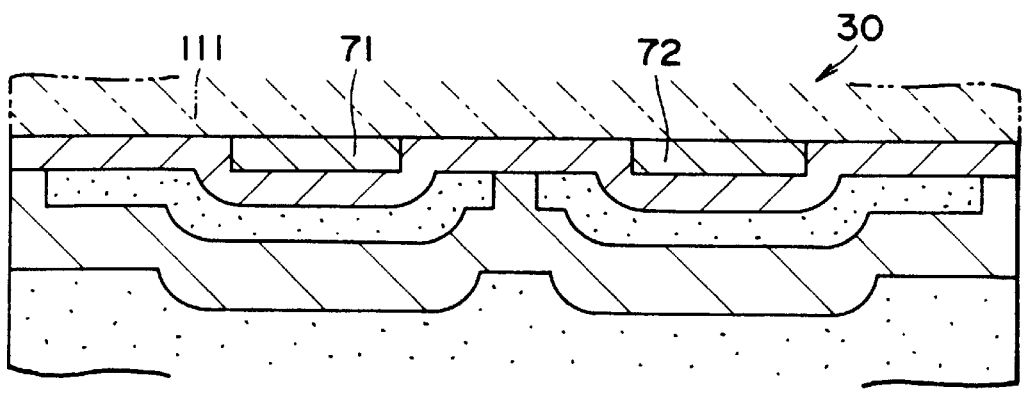

After this, a fifth step shown in FIG. 4G is carried out. In FIG. 4G, part of the polycrystalline silicon layer 51, the boron phosphor silicate glass layer 42 and the substrate 41 are not shown.

In this step, some stock of the silicon substrate 111 (a portion shown with the two-dot broken line) is removed by grinding and polishing until the back gate insulation films 61 and 62 are exposed. Then, respective silicon regions 71 and 72 are formed as isolated islands.

As described above, the SOI substrate 30 is formed.

A method of manufacturing the SOI substrate 30 is as follows. After forming a plurality of island type silicon regions 71 and 72 by providing a groove 112 in a silicon substrate 111, a back gate insulation film 63 is formed on the surface of the silicon substrate 111 including the internal wall of the groove. In addition, after forming island type back gate electrodes 61 and 62 on the back gate insulation film 63 on respective silicon regions 71 and 72, the insulation layer 52 and the polycrystalline silicon layer 51 for bonding are formed. Therefore, when the SOI substrate 30 is formed, the back gate electrodes 61 and 62 between the polycrystalline silicon layer 51 for bonding and respective silicon regions 71 and 72 become electrically isolated.

For forming masks 111 and 112 to be used for doping an impurity in the back gate electrodes 61 and 62 in the method of manufacturing the SOI substrate 30, the masks for forming a p-well region and an n-well region on a bulk silicon substrate can be used. Therefore, for forming the CMOS transistor on the bulk silicon substrate, the mask can be diverted for forming the CMOS transistor on the SOI substrate.

Figure 4H:
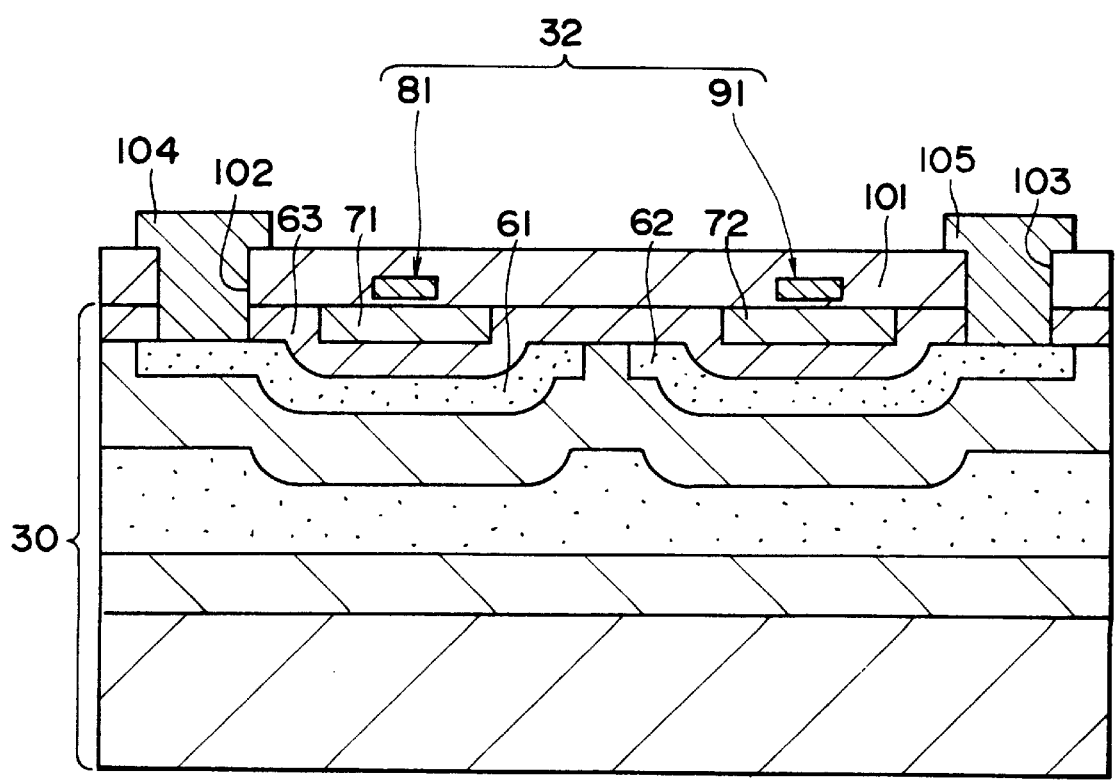

For forming the CMOS transistor 32 on the SOI substrate 30 as shown in FIG. 4H, the nMOS transistor 81 is formed on the silicon region 71 of the SOI substrate 30 and the pMOS transistor 91 is formed on the silicon region 72. The nMOS and pMOS transistors 81 and 91 can be formed by common processes for forming the CMOS transistor on the conventional SOI substrate. An interlayer insulation film 101 is formed to cover the CMOS transistor by, for example, the CVD method. After this, contact holes 102 and 103 connected to the back gate electrodes 61 and 62 are formed on the interlayer insulation film 101 and the back gate insulation film 63 by the lithographic technique and etching.

Subsequently, the electrode type film is formed on the insides of the contact holes 102 and 103 and the interlayer insulation film 101 by a sputtering method, depositing method or CVD method. And thereafter, the pickup electrodes 104 and 105 are formed to connect the back gate electrodes 61 and 62 through the contact holes 102 and 103 by the lithographic technique and etching.

As described above, the present invention enables to apply a predetermined voltage to each back gate electrode since the back gate electrodes are provided through the back gate insulation film on respective silicon region sides between the silicon regions and the polycrystalline silicon layer. The pickup electrodes are also connected respectively to the back gate electrodes. Therefore, the silicon regions are not electrically affected by the potential of the polycrystalline silicon layer owing to the static shielding effect of the back gate electrodes when the predetermined potential is applied to the polycrystalline silicon layer. Accordingly, the active regions and the nodes of MOS transistors formed on respective silicon regions are not affected by the potential of the polycrystalline silicon layer. Consequently, the electrical characteristics of the CMOS transistor can be stabilized.

A method of manufacturing the SOI substrate for the CMOS transistor is as follows. After forming a plurality of island type silicon regions on the silicon substrate, a back gate insulation film is formed to cover respective silicon regions. In addition, after further forming the island type back gate electrodes on the back gate insulation film on respective silicon regions, the insulation layer and the polycrystalline silicon layer for bonding are formed. Therefore, when the SOI substrate is formed, the back gate electrodes to be provided between the polycrystalline silicon layer for bonding and the silicon regions can be formed to be electrically isolated.

What is claimed is:

1. A method for manufacturing an SOI substrate for a CMOS transistor comprising the steps of:
   providing grooves in a silicon substrate to form a plurality of convex silicon regions;
   forming a back gate insulation film on a surface of said silicon substrate;
   forming back gate electrodes associated with said convex silicon regions, said back gate electrodes being disposed on said back gate insulation film, wherein said back gate electrodes are electrically isolated from each other and are respectively connected to different, independent electrodes such that different voltages can be applied independently to respective back gate electrodes;
   introducing a p-type impurity in at least one of said back gate electrodes associated with a convex silicon region where an nMOS transistor is to be formed and introducing an n-type impurity in at least one of said back gate electrodes associated with a convex silicon region where a pMOS transistor is to be formed;
   forming an insulation layer over said back gate electrodes and forming a polycrystalline silicon layer on said insulation layer;
   grinding a surface of said polycrystalline silicon layer;
   bonding a second substrate with the surface of said polycrystalline silicon layer; and
   removing some of said silicon substrate to expose said back gate insulation film and isolate said convex silicon regions.

2. A method for manufacturing an SOI substrate for a CMOS transistor according to claim 1, wherein said step of providing grooves is performed by etching said silicon substrate.

3. A method for manufacturing an SOI substrate for a CMOS transistor according to claim 2, wherein said etching is dry etching.

4. A method for manufacturing an SOI substrate for a CMOS transistor according to claim 1, wherein said step of forming a back gate insulation film comprises thermal oxidation to provide a thermally oxidized film on the surface of said silicon substrate.

5. A method for manufacturing an SOI substrate for a CMOS transistor according to claim 4, wherein, subsequent to said thermal oxidation, silicon oxide is deposited by the CVD method to form said back gate insulation film.

6. A method for manufacturing an SOI substrate for a CMOS transistor according to claim 1, wherein said step for forming said back gate electrodes further comprises:
   forming a polycrystalline silicon film on said back gate insulation film; and
   removing some of said polycrystalline silicon film from said grooves to define sections of said polycrystalline silicon film associated with said convex silicon regions.

7. A method for manufacturing an SOI substrate for a CMOS transistor according to claim 6, wherein said step of forming a polycrystalline silicon film is performed using CVD.

8. A method for manufacturing an SOI substrate for a CMOS transistor according to claim 6, wherein said step of removing some of said polycrystalline silicon film is performed by etching.

9. A method for manufacturing an SOI substrate for a CMOS transistor according to claim 1, wherein said step of introducing a p-type impurity comprises the steps of:
   forming a mask over said back gate electrodes which opens over said convex silicon region where an nMOS transistor is to be formed;
   implanting said p-type impurity by ion implantation; and
   removing said mask.

10. A method for manufacturing an SOI substrate for a CMOS transistor according to claim 9, wherein said ion implantation implants boron or boron difluoride ions as said p-type impurity.

11. A method for manufacturing an SOI substrate for a CMOS transistor according to claim 9, wherein said step of removing said mask is performed by ashing treatment.

12. A method for manufacturing an SOI substrate for a CMOS transistor according to claim 1, wherein said step of introducing an n-type impurity comprises the steps of:
   forming a mask over said back gate electrodes which opens over said convex silicon region where a pMOS transistor is to be formed;
   introducing said n-type impurity by lithography; and
   removing said mask.

13. A method for manufacturing an SOI substrate for a CMOS transistor according to claim 12, wherein said n-type impurity is arsenic, phosphor or antimony ions.

14. A method for manufacturing an SOI substrate for a CMOS transistor according to claim 12, wherein said step of removing said mask is performed by ashing treatment.

15. A method for manufacturing an SOI substrate for a CMOS transistor according to claim 1, wherein said insulation layer is formed by CVD.

16. A method for manufacturing an SOI substrate for a CMOS transistor according to claim 1, wherein said polycrystalline layer is formed by CVD.

17. A method for manufacturing an SOI substrate for a CMOS transistor according to claim 1, wherein a surface of said second substrate which is bonded to said polycrystalline layer comprises a layer of boron phosphor silicate glass.

18. A method for manufacturing an SOI substrate for a CMOS transistor according to claim 1, further comprising the steps of:

forming at least one pMOS transistor using one of said convex silicon regions; and forming at least one nMOS transistor using one of said convex silicon regions.

19. A method for manufacturing an SOI substrate for a CMOS transistor according to claim 18, further comprising the steps of:

forming an interlayer insulation film over said pMOS and said nMOS transistors and said back gate insulation film;

forming contact holes through said interlayer insulation film and said back gate insulation film; and providing pickup electrodes connected to said back gate electrodes through said contact holes.

20. A method for manufacturing an SOI substrate for a CMOS transistor according to claim 19, wherein said pickup electrodes are formed by sputtering.

21. A method for manufacturing an SOI substrate for a CMOS transistor according to claim 9, wherein said step of removing said mask is performed by wet treatment.

22. A method for manufacturing an SOI substrate for a CMOS transistor according to claim 12, wherein said step of removing said mask is performed by wet treatment.

23. A method for manufacturing an SOI substrate for a CMOS transistor according to claim 1, further comprising forming pickup electrodes through said back gate insulation film, each of which is in contact with one of said back gate electrodes.

* * * * *